United States Patent
Lin et al.

(10) Patent No.: US 10,347,302 B1
(45) Date of Patent: Jul. 9, 2019

(54) MEMORY LAYOUT FOR PREVENTING REFERENCE LAYER FROM BREAKS

(71) Applicant: EOREX CORPORATION, Hsinchu County (TW)

(72) Inventors: Cheng-Lung Lin, Hsinchu County (TW); Wan-Tung Liang, Hsinchu County (TW)

(73) Assignee: EOREX CORPORATION, Zhubei, Hsinchu County (TW)

( * ) Notice: Subject to any disclaimer, the term of this patent is extended or adjusted under 35 U.S.C. 154(b) by 0 days.

(21) Appl. No.: 16/035,868

(22) Filed: Jul. 16, 2018

(51) Int. Cl.
*G11C 5/06* (2006.01)
*G11C 11/21* (2006.01)
*G11C 5/14* (2006.01)

(52) U.S. Cl.
CPC .............. *G11C 5/06* (2013.01); *G11C 5/14* (2013.01); *G11C 11/21* (2013.01)

(58) Field of Classification Search
CPC .............. G11C 5/06; G11C 5/14; G11C 11/21
See application file for complete search history.

(56) References Cited

U.S. PATENT DOCUMENTS

| 2016/0218081 A1* | 7/2016 | Kim | H01L 24/19 |
| 2016/0225714 A1* | 8/2016 | Yun | H01L 27/11573 |
| 2017/0103958 A1* | 4/2017 | Lee | H01L 24/17 |
| 2017/0207119 A1* | 7/2017 | Noh | H01L 21/76838 |

* cited by examiner

*Primary Examiner* — Tri M Hoang
(74) *Attorney, Agent, or Firm* — Jackson IPG PLLC; Demian K. Jackson

(57) ABSTRACT

A memory comprising substrates is provided. Each substrate comprises a through-hole area at center; a first contact area at a side of the through-hole area; and a second contact area at another side of the through-hole area. The substrate uses its first or second contact area to mutually electrically connects to the first or second contact area of the another substrate through the through-hole area. After the pins of the memory having at least PAR pin included are electrically connects to the first and second contact areas of the substrate, all the substrates obtain mutual connections across layers through signal lines with the guidance of the through-hole areas. Thus, on fabricating the memory, reference layer is effectively prevented from breaks with good power distribution and sufficient wiring space achieved while good signal integrity is further maintained.

9 Claims, 2 Drawing Sheets

MEMORY LAYOUT FOR PREVENTING REFERENCE LAYER FROM BREAKS

TECHNICAL FIELD OF THE INVENTION

The present invention relates to a memory, more particularly, to effectively preventing reference layer from breaks on fabricating the memory, where good power distribution and sufficient wiring space are obtained with good signal integrity further maintained.

DESCRIPTION OF THE RELATED ART

In general, a conventional memory has its pins obtain separate electrical connections according to requirements. Then, contacts obtain mutual electrical connections with signal lines. Thus, the setting of the memory is completed.

Conventional wiring for the memory provides through-holes on places of an entire substrate. The pins directly electrically connect to the contacts through the through-holes with the signal lines. As a result, the circuit layout is relatively cramped in space. In addition, power distribution is sometimes so poor that a reference layer may be broken on wiring. The reference layer of the memory may lose its signal integrity.

Hence, the prior art does not fulfill all users' expectations on actual use.

SUMMARY OF THE INVENTION

The main purpose of the present invention is to, after the pins of a memory device are electrically connected to a first and a second contact area of a substrate, separately mutually connect the first or the second contact areas of the other substrates in the same stack across layers through through-hole areas with corresponding signal lines. On fabricating the memory device, a reference layer is effectively prevented from breaks; good power distribution and sufficient wiring space are obtained with good signal integrity further maintained.

To achieve the above purpose, the present invention is a memory device having a layout preventing a reference layer from breaks comprising a plurality of substrates, where each one of the substrates comprises a through-hole area, a first contact area and a second contact area. The through-hole area is set at a center of one of the substrates for connection. The first contact area is set at a side of the through-hole area on the one of the substrates for connection. The first contact area connects to pins of the memory device through signal lines. The second contact area is set at another side of the through-hole area on the one of the substrates for connection. The second contact area connects to pins of the memory device through signal lines and at least a command/address parity (PAR) pin is included in the pins of the memory device to be connected and one of the substrates uses its first or second contact area to be mutually electrically connected to the first or second contact area of another one of the substrates. Accordingly, a novel memory device having a layout preventing reference layer from breaks is obtained.

BRIEF DESCRIPTION OF THE DRAWINGS

The present invention will be better understood from the following detailed description of the preferred embodiment according to the present invention, taken in conjunction with the accompanying drawings, in which.

DESCRIPTION OF THE PREFERRED EMBODIMENT

The following description of the preferred embodiment is provided to understand the features and the structures of the present invention.

Figure 1:
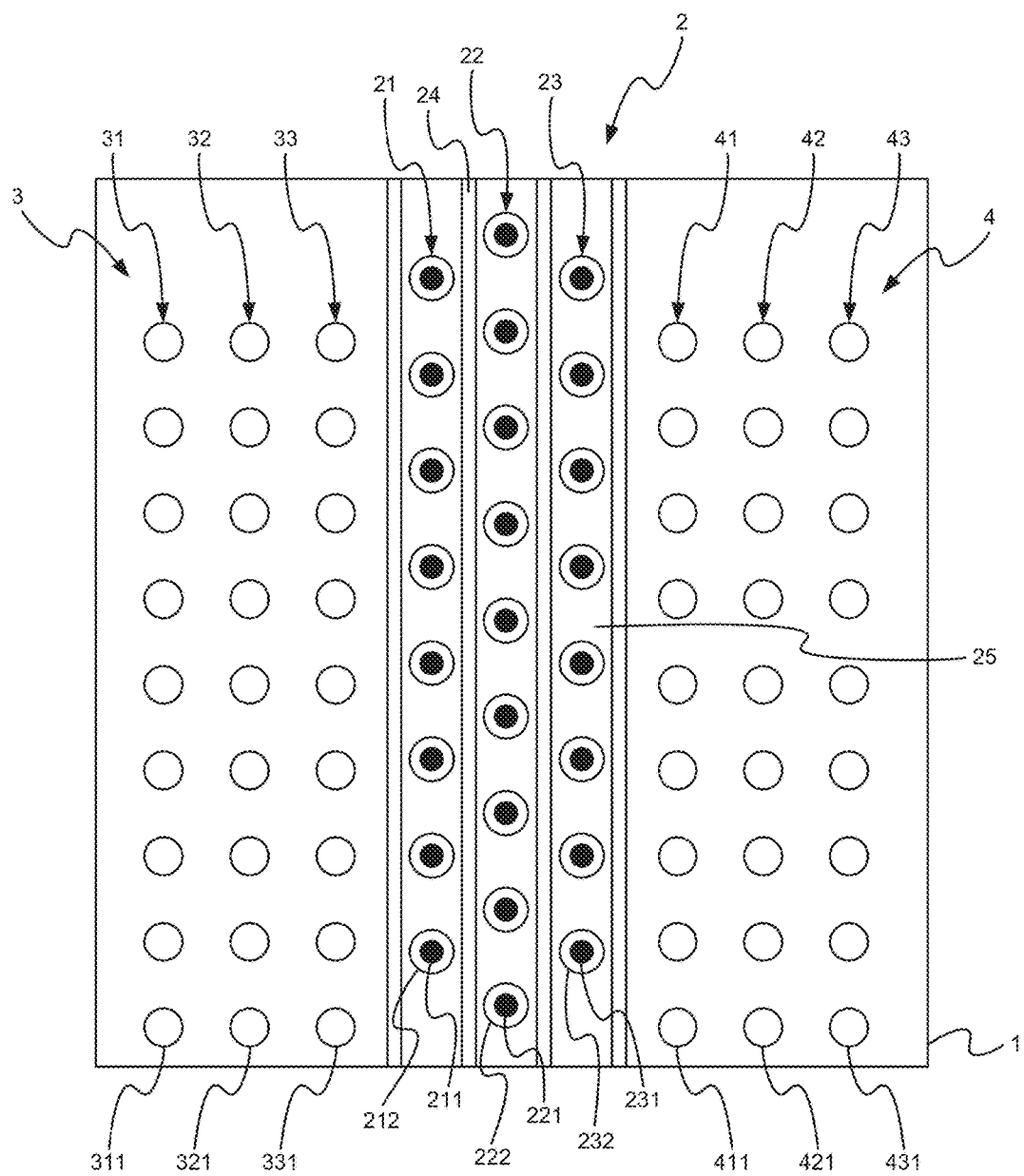
FIG. 1 is a view showing a preferred embodiment according to the present invention and FIG. 2 is a view showing a state-of-use of the preferred embodiment.
Figure 2:
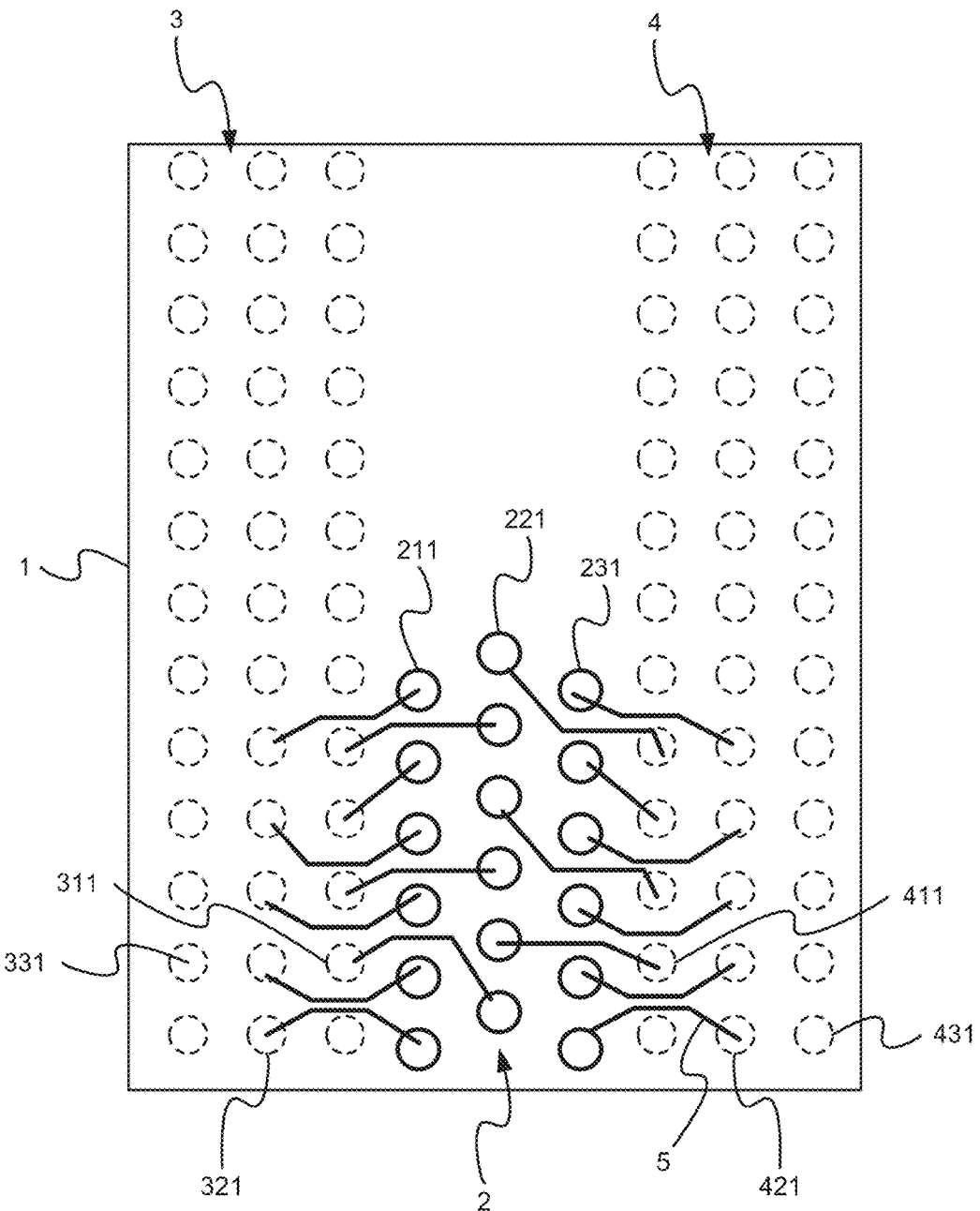

Please refer to FIG. 1 to FIG. 2, which are a view showing a preferred embodiment according to the present invention and a view showing a state-of-use of the preferred embodiment respectively. As shown in the figures, the present invention is a memory device having a layout preventing a reference layer from breaks comprising a plurality of substrates 1. Each one of the substrates 1 comprises a through-hole area 2, a first contact area 3, and a second contact area 4.

The substrates 1 are circuit boards and the substrates 1 are arranged in a vertically corresponding or stacking way.

The through-hole area 2 is set at a center of the substrate 1 for connection.

The first contact area 3 is set on the substrate 1 and located at a side of the through-hole area 2 for connection. The first contact area 3 connects to pins of the memory device through signal lines (not shown in the figures).

The second contact area 4 is set on the substrate 1 and located at another side of the through-hole area 2 for connection. The second contact area 4 connects to pins of the memory device through signal lines (not shown in the figures). At least a command/address parity (PAR) pin is included in the pins of the memory device. The substrate 1 uses its first or second contact area 3, 4 to be mutually electrically connected with the first or the second contact area 3, 4 of another one of the substrates 1 through the through-hole area 2.

After the pins of the memory electrically connect to the first and the second contact areas 3, 4 of one substrate 1, signal lines 5 corresponding to the first and the second contact areas 3, 4 electrically connect to the required first or second contact area 3, 4 of another one of the substrates 1 across a reference layer though the guidance of the through-hole area 2 (not shown in the figures). Thus, on fabricating the memory device, a reference layer is effectively prevented from breaks with good power distribution and sufficient wiring space achieved while good signal integrity is further maintained.

The through-hole area 2 comprises a first through-hole row 21, a second through-hole row 22 at a side of the first through-hole row 21 in one direction, and a third through-hole row 23 at a side of the second through-hole row 22 in the direction. The first through-hole row 21 comprises eight instances of first through-hole 211; the second through-hole row 22 comprises nine instances of second through-hole 221; the third through-hole row 23 comprises eight instances of third through-hole 231. A separating zone 24 is set between every neighboring two rows in the first through-hole row 21, the second through-hole row 22, and the third through-hole row 23. Each one of the first, the second, and the third through-holes 211, 221, 231 has an insulating zone 212, 222, 232 surrounding an outside edge and a power-connecting zone (not shown in the figures) is set between the first, the second, and the third through-holes 211, 221, 231.

In a state-of-use, the first contact area 3 comprises a first contact row 31, a second contact row 32 at a side of the first contact row 31 in one direction, and a third contact row 33 at a side of the second contact row 32 in the direction and each one of the first contact row 31, the second contact row 32, and the third contact row 33 comprises nine instances of first contact 311, second contact 321, and third contact 331, respectively.

In a state-of-use, the second contact area 4 comprises a fourth contact row 41, a fifth contact row 42 at a side of the fourth contact row 41 in one direction, and a sixth contact row 43 at a side of the fifth contact row 42 in the direction and each one of the fourth contact row 41, the fifth contact row 42, and the sixth contact row 43 comprises nine instances of fourth contact 411, fifth contact 421, and sixth contact 431, respectively.

While the memory device is electrically connected with the first contact area 3 and the second contact area 4 of one of the substrates 1, a state-of-use is described as follows:

On connecting the memory device, a VDD pin of the memory device is connected to the first contact 311 of the first contact row 31 in the first contact area 3. Address A13 pin of the memory device is connected to the second contact 321 of the second contact row 32 in the first contact area 3. Address A17 pin of the memory device is connected to the third contact 331 of the third contact row 33 in the first contact area 3. A PAR pin of the memory device is connected to the fourth contact 411 of the fourth contact row 41 in the second contact area 4. Address A11 pin of the memory device is connected to the fifth contact 421 of the fifth contact row 42 in the second contact area 4 and a VSS pin of the memory device is connected to the sixth contact 431 of the sixth contact row 43 in the second contact area 4.

As is described, the through-hole area 2 is set between the first contact area 3 and the second contact area 4. Hence, when the first contact area 3 and the second contact area 4 of the substrate 1 are electrically connected to the another substrate 1 (not shown in the figures), the signal lines 5 are separately wired and guided to pass through two surfaces of the substrate 1 with the first, the second, and the third through-holes 211,221,231 of the first, the second and the third through-hole rows 21, 22, 23 in the through-hole area 2. Then, after the first, the second, and the third contacts 311, 321, 331 in the first contact area 3 and the fourth, the fifth, and the sixth contacts 411, 421, 431 in the second contact area 4 are passed through the first, the second and the third through-holes 211, 221, 231 as required, the signal lines 5 are electrically connected across a reference layer to the first contact area 3 and the second contact area 4 of the another substrate 1. Therein, a power line or grounding line is connected with the power-connecting zone (not shown in the figures) according to requirements. In a state-of-use, the signal lines 5 are of the same length, so that the signal lines 5 are wired in a clean and neat way with the reference layer prevented from breaks and, owing to the same lengths, good power distribution and sufficient wiring space are obtained.

Furthermore, the first, the second, and the third through-hole rows 21, 22, 23 are separated by the separating zones 24 for avoiding interference between the signal lines 5 and the signal lines 5 use the insulating zones 212, 222, 232 to avoid shortcuts of contacting the power-connecting zone (not shown in the figures) on passing through the first, the second and the third through-holes 211, 221, 231.

To sum up, the present invention is a memory device having a layout preventing a reference layer from breaks where, after the pins of a memory device are electrically connected to a first and a second contact areas of a substrate, the first or the second contact areas of the other substrates in the same stack can separately mutually connect across required substrate layers through through-hole areas with corresponding signal lines On fabricating the memory device, a reference layer is effectively prevented from breaks to obtain good power distribution and sufficient wiring space with good signal integrity further maintained.

The preferred embodiment herein disclosed is not intended to unnecessarily limit the scope of the invention. Therefore, simple modifications or variations belonging to the equivalent of the scope of the claims and the instructions disclosed herein for a patent are all within the scope of the present invention.

What is claimed is:

1. A memory device assembly having a layout preventing a reference layer from breaks and comprising a memory device and a plurality of substrates, each one of said substrates comprising:
   a through-hole area, wherein said through-hole area is located at a center of one of said substrates to obtain connection;
   a first contact area, wherein said first contact area is located at a side of said through-hole area on said one of said substrates to obtain connection and wherein said first contact area connects to pins of the memory device through signal lines; and
   a second contact area, wherein said second contact area is located at another side of said through-hole area on said one of said substrates to obtain connection and wherein said second contact area connects to pins of the memory device through signal lines, wherein at least a command/address parity (PAR) pin is included in said pins of the memory device and wherein one of said substrates uses a corresponding contact area of said one of said substrates to be mutually electrically connected with another corresponding contact area of another one of said substrates and said corresponding contact area is selected from a group consisting of a corresponding first contact area and a corresponding second contact area.

2. The memory device assembly according to claim 1, wherein said through-hole area comprises a first through-hole row, a second through-hole row, and a third through-hole row and wherein said second through-hole row is located at a side of said first through-hole row in one direction and said third through-hole row is located at a side of said second through-hole row in said direction.

3. The memory device assembly according to claim 2, wherein said first through-hole row comprises eight instances of first through-hole; said second through-hole row comprises eight instances of second through-hole; and said third through-hole row comprises eight instances of third through-hole.

4. The memory device assembly according to claim 3, wherein a separating zone is deposed between every two neighboring rows in said first through-hole row, said second through-hole row, and said third through-hole row.

5. The memory device assembly according to claim 3, wherein each one of said first, said second, and said third through-holes has an insulating zone surrounding an outside edge.

6. The memory device assembly according to claim 1, wherein said first contact area comprises a first contact row, a second contact row and a third contact row said second contact row is located at a side of said first contact row in one direction and said third contact row is located at a side of said second contact row in said direction and wherein each one of said first contact row, said second contact row, and said third contact row comprises nine instances of first contact, second contact, and third contact, respectively.

7. The memory device assembly according to claim 1, wherein said second contact area comprises a fourth contact row, a fifth contact row, and a sixth contact row and wherein said fifth contact row is located at a side of said fourth contact row in one direction and said sixth contact row is located at a side of said fifth contact row in said direction and wherein each one of said first contact row, said second contact row, and said third contact row comprises nine instances of fourth contact, fifth contact, and sixth contact, respectively.

8. The memory device assembly according to claim 1, wherein each one of said first and said second contact areas of said one of said substrates uses corresponding signal lines to pass through two surfaces of said one of said substrates with said through-hole area of said one of said substrates to obtain an electrical connection to a contact area selected from a group consisting of said first contact area of another one of said substrates and said second contact area of another one of said substrates.

9. The memory device assembly according to claim 8, wherein said signal lines are of the same length.

\* \* \* \* \*